United States Patent
Yeh (10) Patent No.: US 7,020,003 B2
(45) Date of Patent: Mar. 28, 2006

(54) DEVICE AND METHOD FOR COMPENSATING DEFECT IN SEMICONDUCTOR MEMORY

(75) Inventor: Jun-Lin Yeh, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 45 days.

(21) Appl. No.: 10/710,123

(22) Filed: Jun. 21, 2004

(65) Prior Publication Data

US 2005/0174827 A1   Aug. 11, 2005

(30) Foreign Application Priority Data

Feb. 11, 2004  (TW) .............................. 93103144 A (51) Int. Cl.
*G11C 13/00* (2006.01)

(52) U.S. Cl. ............ 365/120; 365/230.08; 365/230.06; 365/200; 365/189.05

(58) Field of Classification Search ................ 365/120, 365/230.06, 500, 230.08, 189.05
See application file for complete search history.

(56) References Cited

U.S. PATENT DOCUMENTS

| | | | |
|---|---|---|---|
| 4,007,452 A | 2/1977 | Hoff, Jr. ........................ | 365/63 |
| 4,376,300 A | 3/1983 | Tsang .......................... | 365/200 |
| 5,233,559 A | 8/1993 | Brennan, Jr. ............ | 365/185.09 |
| 6,052,318 A * | 4/2000 | Kirihata et al. ............. | 365/200 |
| 6,144,577 A * | 11/2000 | Hidaka ......................... | 365/63 |
| 6,646,932 B1 * | 11/2003 | Kato et al. .................. | 365/200 |
| 2002/0176296 A1 * | 11/2002 | Chen et al. .................. | 365/201 |

* cited by examiner

*Primary Examiner*—Andrew Q. Tran
*Assistant Examiner*—Toan Le
(74) *Attorney, Agent, or Firm*—Jianq Chyun IP Office (57) ABSTRACT

A device for compensating a semiconductor memory defect suitable for a semiconductor memory is provided. The device comprises: a memory array, the memory array having a memory region consisting of a plurality of memory cells, the memory array being coupled to the address decoder circuit and the sensing circuit for storing data, if the memory array has a defect, the memory array is divided into a plurality of sub-memory regions, wherein one of the plurality of sub-memory regions is defectless, the memory array is replaced by the defectless sub-memory regions for storing data. A selection circuit coupled to the control unit, selects one of the memory region and the defectless sub-memory region to store data. A first input address buffer coupled to the control unit and the address decoder circuit has an address input port and an address output port. The address input port receives a most significant bit address signal, wherein if the memory array is defectless, the selection circuit outputs a selection signal to select the memory region to store data and makes the control unit control the address output port to output the most significant bit address signal to the address decoder circuit. If the memory array has the defect, the selection circuit outputs a selection signal to select the defectless memory region to store data and makes the control unit control the address output port to output the selection signal to the address decoder circuit.

12 Claims, 5 Drawing Sheets

DEVICE AND METHOD FOR COMPENSATING DEFECT IN SEMICONDUCTOR MEMORY

CROSS REFERENCE TO RELATED APPLICATIONS

This application claims the priority benefit of Taiwan application serial no. 93103144, filed on Feb. 11, 2004, the full disclosure of which is incorporated herein by reference.

BACKGROUND OF INVENTION

1. Field of the Invention

This invention generally relates to a device and a method for a semiconductor memory, and more particularly to a device and method for compensating defect in a semiconductor memory.

2. Description of Related Art

Recently, because of the prevalence of the computers, the semiconductor memory device such as non-volatile semiconductor memory has been developed and manufactured.

Figure 1:
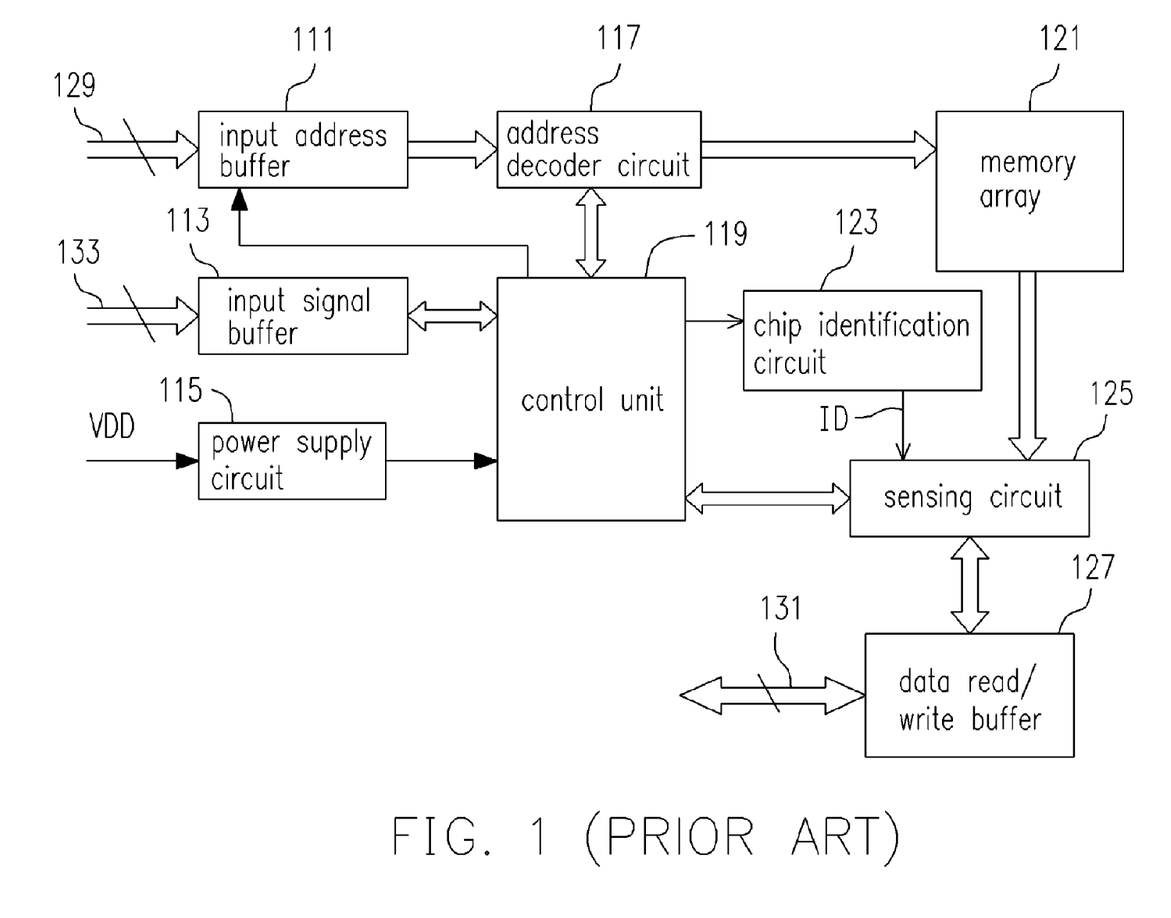
FIG. 1 is a block diagram of a conventional semiconductor memory structure.

FIG. 1 is a block diagram of a conventional semiconductor memory structure. Referring to FIG. 1, when the user initiate to read the data stored in the semiconductor memory, the address bus 129 will send a set of address signals to the input address buffer 111; the control signal bus 133 will send a control signal to the control unit 119. The control unit 119 based on the control signal controls the input address buffer 111 to send the address signals to the address decoder circuit 117, controls the address decoder circuit 117 to convert the address signals to a real address, and sends the real address to the memory array 121 and the control unit 119 respectively. The control unit 119 based on the real address controls the sensing circuit 125 to retrieve the data from the memory array 121. The data will be sent to the data bus 131 via the data read/write buffer 127. Hence, the user can read the data from the data bus 131. When the user would like to write the data, the procedure is very similar. The difference is that the data is sent via the data bus 131 and the data read/write buffer 127 into the sensing circuit 125; the control unit 119 based on the real address control the sensing circuit 125 sends the data via the data bus 131 into the memory array 121 for storage.

Referring to FIG. 1, the semiconductor memory includes a power supply circuit 115 and a chip identification circuit 123. The power supply circuit 115 is coupled to the power source VDD to provide the power for the operation of the semiconductor memory. The chip identification circuit 123 is for sending identification signal to show the memory size of the memory array 121.

In the light of the above, the address for accessing the data in a conventional semiconductor is in the memory array. When there is a minor defect in the memory array during the manufacturing process, the conventional memory array become useless, which causes a lower yield rate. Therefore, redundancy is typically built into the array. Redundancy permits one to provide full functionality from an array that has a small number of defects by using redundant portions of the array in place of those portions of the array that are defective. U.S. Pat. No. 5,233,559, for example, describes a redundancy scheme used to provide row redundancy in a nonvolatile memory array.

There are limits to the benefits of providing redundancy. Redundant circuits increase the complexity of a part and also occupy precious chip area within the chip. The more redundant circuits one provides, the more likely it becomes that the number of redundant circuits will exceed the number of defects. In such a case, there will be redundant circuits that are unused. Furthermore, the more redundant circuits one provides, the more likely it becomes that a defect will occur in the redundant circuitry. Moreover, no matter how much redundancy one provides to a circuit, if the number of defects is great, there will be insufficient redundancy to compensate for the defects and restore full functionality. Therefore, a significant number of dice are built that must be scrapped because they contain so many defects that they cannot be brought up to full functionality. The cost of producing these defective chips that must be scrapped is included into the cost of producing the fully functional ones.

Various strategies are known that can be used to compensate for memory arrays that cannot be brought up to full functionality. At the wafer level, U.S. Pat. No. 4,007,452 describes a wafer scale integration system and method for interconnecting a plurality of separate memories (or other circuits) on a wafer so as to electrically exclude defective memories and include operative memories. A single discretionary connection is associated with each of the separate memories and this connection is made (or broken) after a memory is tested. In addition to a bidirectional memory bus used for input/output data and addresses, the wafer includes a separate identity bus used to define the memory organization. The identity bus is interconnected by a plurality of increments, one associated with each memory. The signal on the identity bus is incremented by usable memories and this signal is compared to an address on the bi-directional memory bus to select memories in an organized manner. This approach permits one to use a wafer that contains several separate memory arrays even when one or more of the arrays is defective. If, however, a separate memory within the wafer is not fully functional, the operational portions of the partially functional separate memory cannot be used because the entire defective separate memory is disabled.

At the chip level, U.S. Pat. No. 4,376,300 describes a memory system that employs a plurality of partially functional "mostly good" memory chips. For one embodiment, a programmable read only memory (PROM) is programmed to recognize the address of the defective elements of the mostly good memory chips and to cause a redundant memory chip to be selected. For another embodiment, a content-addressable memory (CAM) is employed to provide a new address in response to the addresses of defective elements in the mostly good memories. Although partially functional memory chips can be used if they are mostly good, a small number of defects within a memory chip can render the chip mostly bad and therefore unusable.

SUMMARY OF INVENTION

The present invention is related to a device for compensating defect in a semiconductor memory. This device can work when there is a minor defect in the memory array of the semiconductor memory.

The present invention provides a device for compensating a semiconductor memory defect, suitable for a semiconductor memory, wherein the semiconductor memory comprises a control unit, an address decoder circuit and a sensing circuit. The device comprises a memory array coupled to the address decoder circuit and the sensing circuit for storing data, a selection circuit coupled to the control unit, and a first input address buffer coupled to the control unit and the address decoder circuit. The memory array has a memory region comprising a plurality of memory cells. If the memory array has a defect, the memory array being divided into a plurality of sub-memory regions, one of the defectless sub-memory regions is adapted for replacing the memory array for storing data. The selection circuit is adapted for selecting one of the memory region and the defectless sub-memory region to store data. The first input address buffer includes an address input port and an address output port, the address input port is adapted for receiving a most significant bit address signal, wherein if the memory array is defectless, the selection circuit outputs a selection signal to select the memory region to store data and makes the control unit control the address output port to output the most significant bit address signal to the address decoder circuit, and if the memory array has the defect, the selection circuit outputs a selection signal to select the defectless memory region to store data and makes the control unit control the address output port to output the selection signal to the address decoder circuit.

In an embodiment of the present invention, the device further comprises a chip identification circuit coupled to the control unit. The chip identification circuit comprises an output terminal, a whole signal terminal, and a partial signal terminal. The chip identification circuit is adapted for enabling one of the whole signal terminal and the partial signal terminal to output an identification signal at the output terminal to represent a memory size of the semiconductor memory.

In an embodiment of the present invention, the device further comprises a second input address buffer coupled to the address decoder circuit and the control unit. The second input address buffer comprises a plurality of address input ports and a plurality of address output ports. The plurality of address input ports is adapted for receiving a plurality of address signals except the most significant bit address signal from the first input address buffer and sending the plurality of address signals to the address decoder circuit.

In an embodiment of the present invention, the selection circuit includes: an enable circuit having an enable signal output terminal, a region selection circuit coupled to the control unit, and a NAND gate having two input terminals and an output terminal. The enable circuit is adapted for sending an enable signal via the control unit to the first input address buffer to determine the first input address buffer outputs one of the most significant bit address signal and the selection signal. When the memory region has the defect the region selection circuit sends the selection signal via the control unit to the first input address buffer to select the defectless sub-memory region to store data. One of the two input terminals of the NAND gate is coupled to the enable circuit to receive the enable signal, the other of the two input terminals of the NAND gate is adapted for receiving the control signal. The output terminal of the NAND gate is adapted for outputting a first buffer control signal to the first input address buffer via the control unit.

In an embodiment of the present invention, the first input address buffer includes: a NOR gate having two input terminals and an output terminal, a first transmission gate module having an input terminal, a second transmission gate module having an input terminal and an output terminal and an output terminal and a first inverter having an input terminal and an output terminal. One of the two input terminals of the NOR gate is adapted for receiving the first buffer control signal, the other of the two input terminals of the NOR gate is adapted for receiving the most significant bit address signal. The input terminal of the first transmission gate is coupled to the output terminal of the NOR gate and the output terminal of the first transmission gate is coupled to the address decoder circuit. The input terminal of the second transmission gate is adapted for receiving the selection signal. The output terminal of the second transmission gate is connected to the output terminal of the first transmission gate module and coupled to the address decoder circuit. The input terminal of the first inverter is adapted for receiving the enable signal and the output terminal of the first inverter is coupled to the first transmission gate module and the second transmission gate module.

In an embodiment of the present invention, the first transmission gate module includes a second inverter having an input terminal and an output terminal, the input terminal of the second inverter being coupled to the output terminal of the NOR gate; and a first transmission gate having an input terminal, an output terminal, an N-type MOS terminal, and a P-type MOS terminal, said input terminal of said first transmission gate being coupled to said output terminal of said second inverter, said N-type MOS terminal of said first transmission gate receiving said enable signal, said P-type MOS terminal of said first transmission gate being coupled to said output terminal of said first inverter, said output of said first transmission gate being coupled to said address decoder circuit.

In an embodiment of the present invention, the second transmission gate module includes a second transmission gate having an input terminal, an output terminal, an N-type MOS terminal, and a P-type MOS terminal, the input terminal of the second transmission gate receiving the selection signal, the P-type MOS terminal of the second transmission gate receiving the enable signal, the N-type MOS terminal of the second transmission gate being coupled to the output terminal of the first inverter, the output terminal of the second transmission gate being connected to the output terminal of the first transmission gate and being coupled to the address decoder circuit.

In an embodiment of the present invention, the selection signal is an address-fixed address signal.

In an embodiment of the present invention, the number of the sub-memory regions is a base 2 multiple exponential, the multiple being a positive integral.

The present invention is related to a method for compensating a semiconductor memory defect, suitable for a semiconductor memory. The semiconductor memory comprises a memory region to store data for access and a plurality of address input ports for inputting an address signal, an identification code for representing a size of the semiconductor memory, wherein the address signal determines a location of the data in the memory region. In the method for compensating semiconductor memory defect, first, whether the memory region of the semiconductor memory has a defect is determined. If the memory region of the semiconductor memory has a defect, then the memory region is divided into a plurality of sub-memory regions, wherein one of the plurality of sub-memory regions is defectless. Next, the sub-memory having defects will be no longer been used and the memory will be reduced to the defectless sub-memory region to store the data.

In an embodiment of the present invention, when determining the memory region of the semiconductor memory has the defect, the memory region is divided into two sub-memory regions, wherein one of the sub-memory regions is defectless, and the memory region is replaced with the defectless sub-memory region to store the data. When dis-selecting the memory region with the defective sub-memory region,: a most significant bit address of the plurality of address input ports is disabled and then the most significant bit address is replaced with a selection signal to select to use the defectless sub-memory region only.

In an embodiment of the present invention, the step of using the memory region with the defectless sub-memory region to store the data further includes: modifying the identification code of the semiconductor memory to represent a modified size of the semiconductor memory.

In light of the above, in the device and method for compensating defect in a semiconductor memory of the present invention, when the original memory region in the memory array has a defect, the memory region is divided into a plurality of sub-memory regions having a defectless sub-memory region and then the original memory region is replaced with the defectless sub-memory region for storing data.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Figure 2:
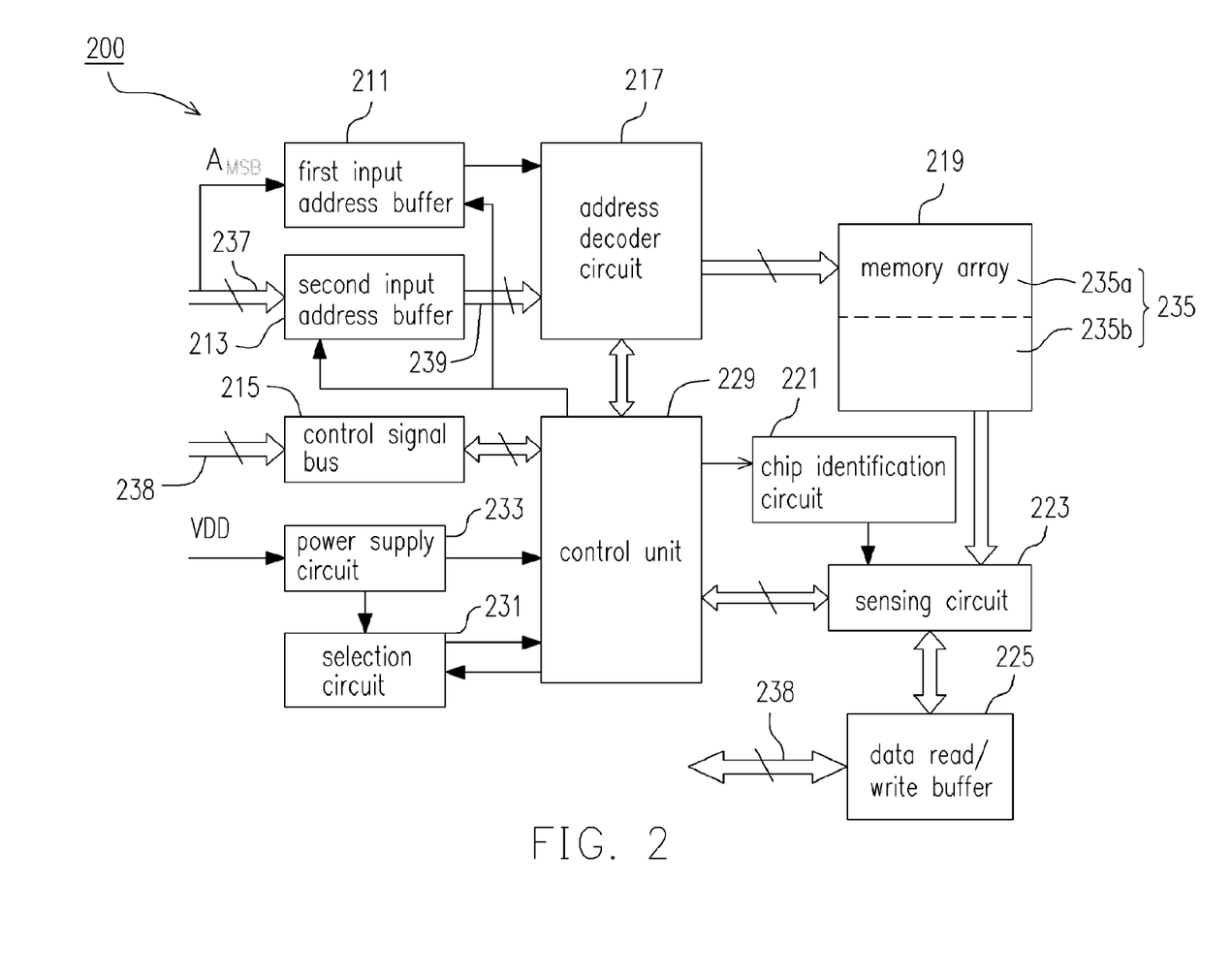
FIG. 2 a block diagram of a semiconductor memory in accordance with an embodiment of the present invention.

FIG. 2 a block diagram of a semiconductor memory in accordance with an embodiment of the present invention. Referring to FIG. 2, in this embodiment, the first input address buffer 211 receives the most significant bite $A_{MSB}$ of the address signal; the second input address buffer 213 receives the remaining bits of the address signal from the address bus 237. The first and second input address buffers 211 and 213 will send all address signal bits to the address decoder circuit 217. The address decoder circuit 217 is coupled to the control unit 229 and the memory array 219. The memory array 219 is coupled to the sensing circuit 223; the sensing circuit is coupled to the data write/read buffer 225; the data write/read buffer 225 is coupled to the data bus 238. In addition, the control unit 229 is coupled to the input signal buffer 215, the first input address buffer 211, the second input address buffer 213, the address decoder circuit 217, the chip identification circuit 221, the sensing circuit 223, the selection circuit 231, and the power supply circuit 233. The input signal buffer 215 is coupled to the data bus 238. The power supply circuit is coupled to the power source VDD.

Referring to FIG. 2, the device of the present invention is suitable for the semiconductor memory such as the memory 200. It includes the memory array 219, the first input address buffer 211, and the selection circuit 231. The memory array 219 is coupled to the address decoder 217 and the sensing circuit 223 in the memory 200. The memory array 219 includes a memory region 235 for storing data. The first input address buffer 211 receives the most significant bit $A_{MSB}$ of the address signal and is coupled to the control unit 229 and the address decoder 217. The selection circuit 231 is coupled to the control unit 229 for sending the selection signal to the control unit 229 so that the control unit 229 can control the output of the first input address buffer 211 based on the selection signal. The memory 200 further includes the power supply circuit 233, which is coupled to the power source VDD in order to supply the power for the memory 200.

Figure 5:
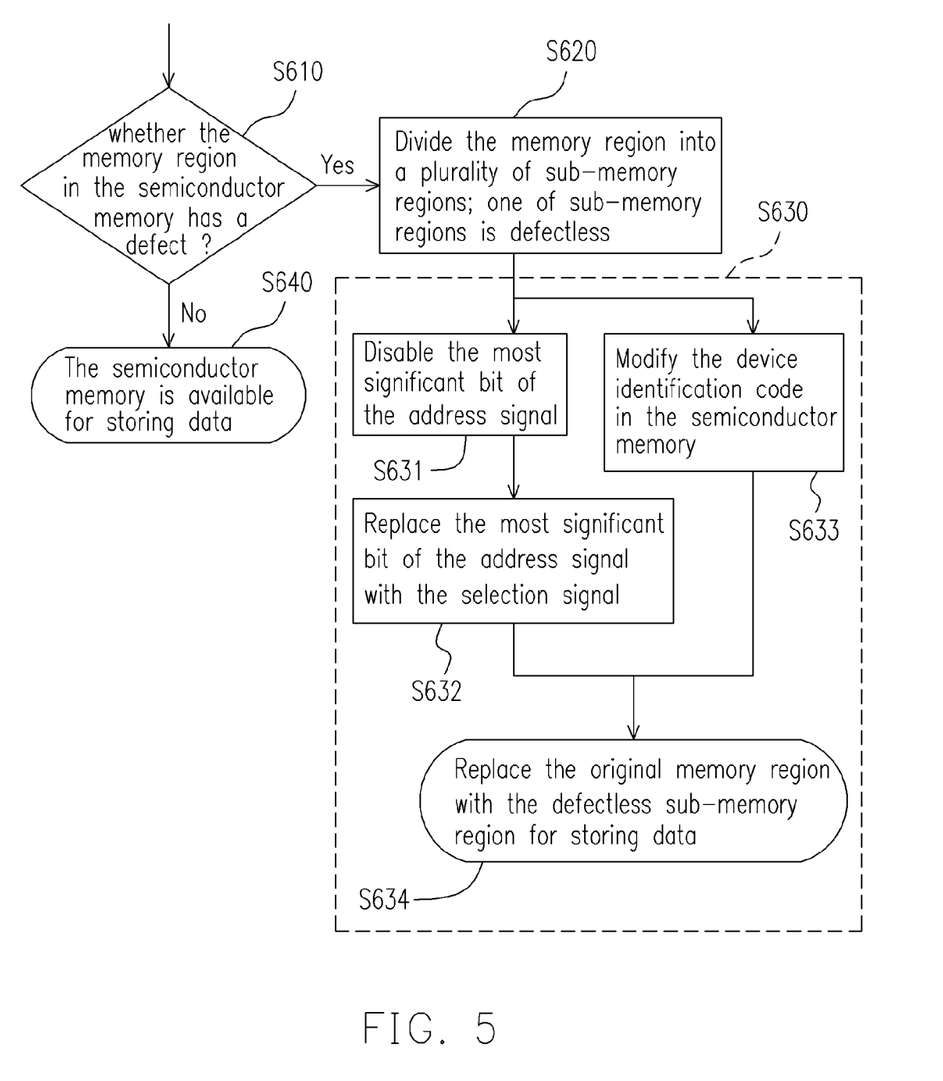
FIG. 5 is a flow chart for compensating defect in a semiconductor memory in accordance with an embodiment of the present invention.

FIG. 5 is a flow chart for compensating defect in a semiconductor memory in accordance with an embodiment of the present invention. Referring to FIGS. 2 and 5, in the method for compensating a semiconductor memory defect, after the memory 200 had been manufactured, whether the memory region 235 has a defect (S610) is determined; when the memory region 235 is determined to have a defect, the memory region 235 is divided into a plurality of sub-memory regions (S620). For example, in this embodiment of the present invention, the memory region 235 is divided into sub-memory regions 235a and 235b.

Referring to FIGS. 2 and 5, the purpose of dividing the memory region 235 into a plurality of sub-memory regions is to obtain a defectless sub-memory region for storing data. For simplicity, we assume that the defect is located in a region of the memory, so that the sub-memory region 235a is a defectless sub-memory region and the sub-memory region 235b is a defected sub-memory region. Therefore, the defectless sub-memory region 235a can replace the original memory region 235 for storing data (S630). That is, the region for storing data shrinks from the original memory region 235 to the defectless sub-memory region 235a. The defected sub-memory region 235b will not be used anymore. It should be noted that although in this embodiment the memory region is divided into two sub-memory regions, the present invention is not limited to this embodiment. One skilled in the art can divide the memory region into more than two sub-memory regions depending on the defects.

Figure 3:
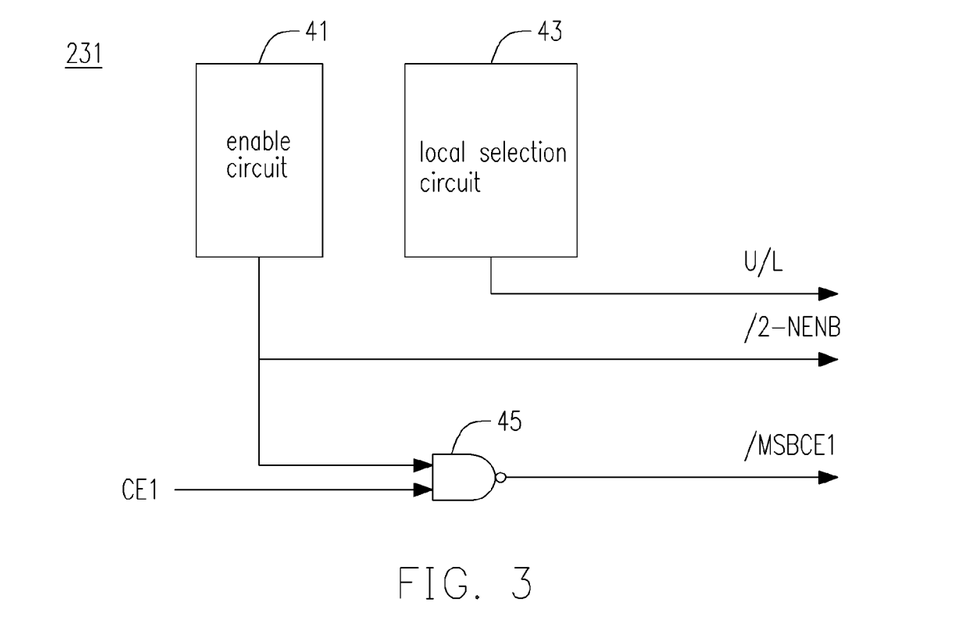
FIG. 3 is a block diagram of a selection circuit in accordance with an embodiment of the present invention.

FIG. 3 is a block diagram of a selection circuit in accordance with an embodiment of the present invention. Referring to FIG. 3, the selection circuit includes an enable circuit 41 and a local selection circuit 43. The enable circuit 41 sends out the enable signal/2-NENB. The local selection circuit 43 sends out the selection signal U/L. The selection circuit further includes a NAND gate 45. One input terminal of the NAND gate 45 receives the enable signal/2-NENB. The other input terminal of the NAND gate 45 receives the control signal CE1. The output terminal of the NAND gate 45 outputs the first buffer control signal/MSBCE1 to the first input address buffer 211. The control signal CE1 is sent to the control unit 229 after it is received by the input signal buffer 215, and is sent to the selection circuit 231 by the control unit 229.

Figure 4:
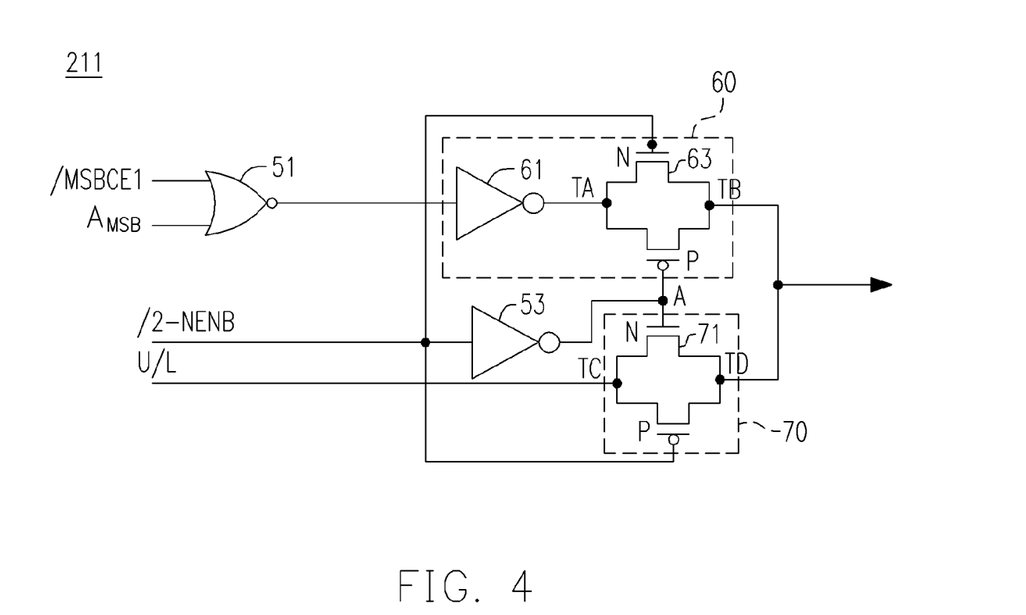
FIG. 4 is a circuit diagram of the first input address buffer in accordance with an embodiment of the present invention.

FIG. 4 is a circuit diagram of the first input address buffer in accordance with an embodiment of the present invention. The first input address buffer includes a NOR gate 51, a first inverter 53, a first transmission gate module 60 and a second transmission gate module 70. The input terminal of the first inverter 53 receives the enable signal/2-NENB; the output terminal of the first inverter 53 is coupled to the first transmission gate module 60 and the second transmission gate module 70.

One of the two input terminals of the NOR gate 51 receives the first buffer control signal/MSBCE1; the other of the two input terminals of the NOR gate 51 receives the most significant bit $A_{MSB}$ of the address signal. The output terminal of the NOR gate 51 is coupled to input terminal of the second inverter 61 in the first transmission gate module 60.

Referring to FIG. 4, the second inverter 61 inverts the signal from the NOR gate and sends it to the input terminal TA of the first transmission gate 63. The first transmission gate 63 has the input terminal TA, an output terminal TB, an NMOS terminal N, and a PMOS terminal P. The NMOS terminal N receives the enable signal/2-NENB; the PMOS terminal P is coupled to the output terminal of the first inverter 53; the output terminal is coupled to the address decoder circuit. The second transmission gate module 70 includes a second transmission gate 71 and has an input terminal TC, an output terminal TD, an NMOS terminal N, and a PMOS terminal P. The input terminal TC of the second transmission gate 71 receives the selection signal U/L form the selection circuit 231. The NMOS terminal N of the second transmission gate is coupled to the output terminal of the first inverter 53. The PMOS terminal P receives the enable signal/2-NENB. The output terminal TD of the second transmission gate 71 is connected to the output terminal TB of the first transmission gate 63 and is coupled to the address decoder circuit 217.

Referring to FIGS. 2 and 5, when the memory region 235 has no defect, the enable signal/2-NENB sent by the enable circuit 41 is logic 1. At the time the truth table of the NAND gate 45 is as follows:

TABLE 1

| /2-NENB | CE1 | /MSBCE1 |
|---------|-----|---------|
| 1       | 0   | 1       |
| 1       | 1   | 0       |

As shown in Table 1, because the enable signal/2-NENB is logic 1, the logic status of the first buffer control signal/MSBCE1 depends on the logic status of the control signal CE1. Because the enable signal/2-NENB is logic 1, the signal received by the PMOS terminal P of the second transmission gate 71 is logic 1, and the signal received by the NMOS terminal N of the second transmission gate 71 is logic 0. Hence, the second transmission gate 71 is off. On the contrary, the signal received by the NMOS terminal N of the first transmission gate 63 is logic 1, and the signal received by the PMOS terminal P of the first transmission gate 63 is logic 0. Hence, the first transmission gate 63 is on. When the first buffer control signal/MSBCE1 is logic 0, the output of the first address buffer 211 is the original most significant bit $A_{MSB}$ of the address signal.

Referring to FIGS. 2 and 5, when the memory region 235 has a defect and thus is divided into the defectless sub-memory region 235a and the sub-memory region 235b, because the defectless sub-memory region 235a is at the region of the less significant bits, the local selection circuit 43 will send out a logic 0 selection signal U/L. And the enable circuit 41 will send out a logic 0 enable signal/2-NENB. At the time the truth table of the NAND gate 45 is as follows:

TABLE 2

| /2-NENB | CE1 | /MSBCE1 |
|---------|-----|---------|
| 0       | 0   | 1       |
| 0       | 1   | 1       |

As shown in Table 2, when the logic status of the enable signal/2-NENB is logic 0, no matter what the logic status of the control signal is, the logic status of the first buffer control signal/MSBCE1 is logic 1.

Referring to FIGS. 2 and 5, the NMOS terminal of the first transmission gate 63 receives a logic 0 enable signal/2-NENB; the PMOS terminal of the first transmission gate 63 receives a logic 1 inverted signal. Hence, the first transmission gate 63 is off. As shown in S631, the most significant bit $A_{MSB}$ of the address signal will be disabled. On the contrary, the PMOS terminal of the second transmission gate 71 receives a logic 0 enable signal/2-NENB; the NMOS terminal of the second transmission gate 71 receives a logic 1 inverted signal. Hence, the second transmission gate 71 is on. As shown in S632, the signal sent to the address decoder circuit 217 by the first input address buffer 211 is a logic 0 selection signal U/L. That is, the selection signal U/L will replace the most significant bit $A_{MSB}$ of the address signal.

Referring to FIGS. 2 and 5, the semiconductor memory device further comprises a second input address buffer 213 having an address input port 237 and an address output port 239. The address input port 237 receives the remaining bits of the address signal except the most significant bit $A_{MSB}$, and the address output port 239 outputs them to the address decoder circuit. That is, because the most significant bit $A_{MSB}$ has been replaced by the selection signal U/L and is fixed, the data can only be stored in the defectless sub-memory region 235a. The defective sub-memory region 235b will be abandoned. Hence, as described in S634, the defectless sub-memory region 235a will replace the original memory region 235 for storing data.

The above embodiment illustrates that when the defect is in the region of the more significant bits and the memory region is divided into two sub-memory regions. Hence, the region of the less significant bits is the defectless sub-memory region. If the defect is in the region of the less significant bits, the selection signal will be changed to logic 1. Or if there is more than one defect, the memory region has to be divided into for example 4 sub-memory regions. Then the most significant bit and the $2^{nd}$ most significant bit have to be changed. Hence, one skilled in the art should modify the embodiment based on the practical application. To simplify the circuit, the recommended number of the sub-memory regions is $2^N$ (e.g., 2, 4, 8, . . . ); i.e., the memory size of each sub-memory region is $\frac{1}{2^N}$ of the original memory size (½, ¼, ⅛, . . . ).

Referring to FIGS. 2 and 5, the semiconductor memory device of the present invention further comprises a chip identification circuit 221. The chip identification circuit 221 can store the device identification code. When the sensing circuit 125 is going to read the data from the memory region 235, the data is sent via the data read/write buffer 127 to the external circuit, or write the data into the memory region 235 via the data read/write buffer 127, the sensing circuit will read the identification signal ID from the chip identification circuit 221 first in order to know the memory size of the memory region 235. Hence, to replace the original memory region 235 with the defectless sub-memory region 235a, the device identification code in the semiconductor memory has to be modified as described in S633.

Figure 6:
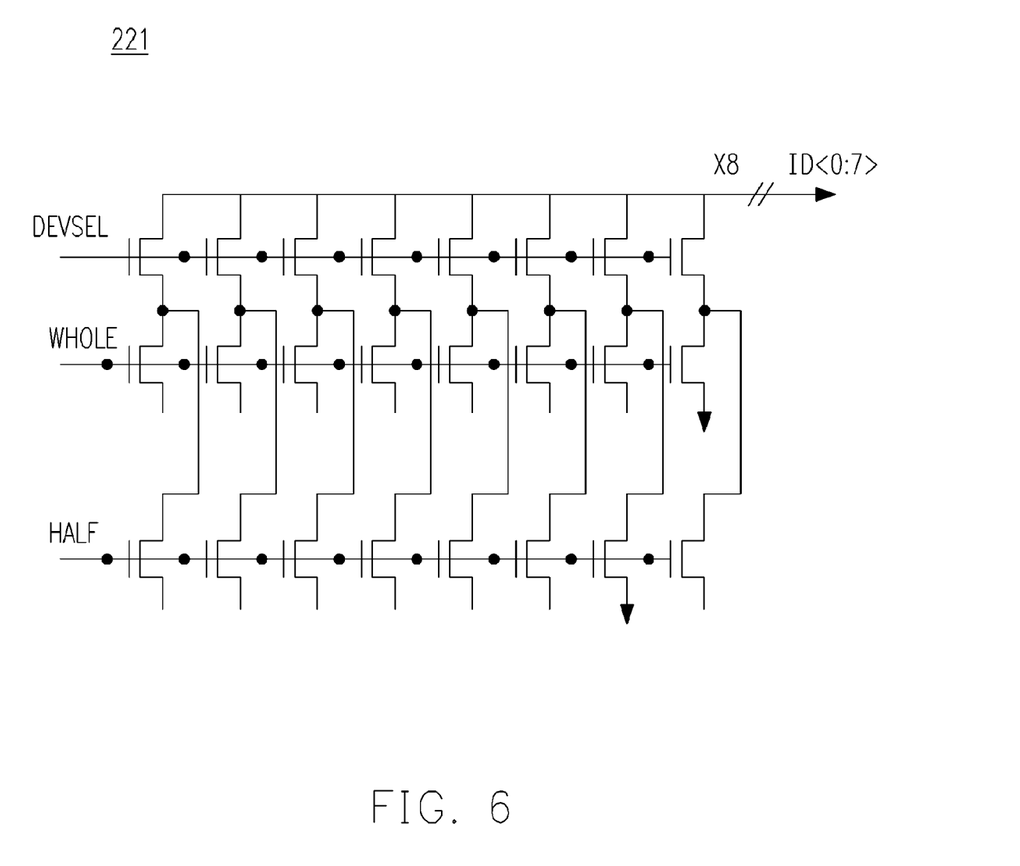
FIG. 6 is the chip identification circuit in accordance with an embodiment of the present invention.

FIG. 6 is the chip identification circuit in accordance with an embodiment of the present invention. Referring to FIGS. 2, 3, and 6, the chip identification circuit 221 in FIG. 6 is a hard wire circuit. When the memory region 235 has no defect and can store data, the control unit 229 will enable the whole signal terminal WHOLE and the chip control terminal DVESEL based on the enable signal/2-NENB from the selection circuit 231. Then the chip identification circuit 221 will output the identification signal ID to the sensing circuit 223. The sensing circuit 223 will be notified that the whole memory region 235 is available to store data. On the contrary, if only the sub-memory region 235a is available to store data, the control unit 229 based on the enable signal/ 2-NENB enables the partial signal terminal HALF of the chip identification circuit 221 and the chip control terminal DEVSEL. Then the sensing circuit 223 will be notified that only the sub-memory region 235a is available to store data.

In light of the above embodiments, when the memory region has a minor defect(s), a defectless sub-memory region can be separated from the defective sub-memory region to replace the original memory region. Hence, the defected semiconductor memory is still usable so that the yield rate can be improved. Further, the present invention is applied to check the semiconductor memories on the wafer after the manufacture process is complete. If there is any defected semiconductor memory found, a mark will be made. After checking every semiconductor memory on the wafer, all defected semiconductor memories will be divided at the same time. By doing so, we don't have to divide the defective semiconductor memories once at a time so as to reduce the cost. Further, because each defective semiconductor memory has been made, the packaging factory can know the size of the defective semiconductor memory, which facilitates the packaging factory for packaging.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

The invention claimed is:

1. A device for compensating a semiconductor memory defect, suitable for a semiconductor memory, said semiconductor memory including a control unit, an address decoder circuit, and a sensing circuit, said device comprising:
   a memory array, comprising a memory region having a plurality of memory cells, said memory array being coupled to said address decoder circuit and said sensing circuit for storing data, wherein if said memory array has a defect, said memory array is divided into a plurality of sub-memory regions, one of said plurality of sub-memory regions is defectless, and wherein said memory array is replaced with said defectless sub-memory region for storing data;
   a selection circuit, coupled to said control unit, said selection circuit selecting one of said memory region and said defectless sub-memory region to store data; and
   a first input address buffer, coupled to said control unit and said address decoder circuit, said first input address buffer including an address input port and an address output port, said address input port receiving a most significant bit address signal;
   wherein if said memory array is defectless, said selection circuit outputs a selection signal to select said memory region to store data and makes said control unit control said address output port to output said most significant bit address signal to said address decoder circuit;
   if said memory array has said defect, said selection circuit outputs a selection signal to select said defectless memory region to store data and makes said control unit control said address output port to output said selection signal to said address decoder circuit.

2. The device of claim 1, further comprising a chip identification circuit coupled to said control unit, said chip identification circuit including an output terminal, a whole signal terminal, and a partial signal terminal, said chip identification circuit enabling one of said whole signal terminal and said partial signal terminal to output an identification signal at said output terminal to represent a memory size of said semiconductor memory.

3. The device of claim 1, further comprising a second input address buffer coupled to said address decoder circuit and said control unit, said second input address buffer including a plurality of address input ports and a plurality of address output ports, said plurality of address input ports receiving a plurality of address signals except said most significant bit address signal from said first input address buffer and sending said plurality of address signals to said address decoder circuit.

4. The device of claim 3, wherein said selection circuit includes:
   an enable circuit, having an enable signal output terminal, wherein said enable circuit sends an enable signal via said control unit to said first input address buffer to determine said first input address buffer and outputs one of said most significant bit address signal and said selection signal;
   a region selection circuit, coupled to said control unit, wherein when said memory region has said defect, said region selection circuit sending said selection signal via said control unit to said first input address buffer to select said defectless sub-memory region to store data; and
   a NAND gate, having two input terminals and an output terminal, wherein one of said two input terminals of said NAND gate is coupled to said enable circuit to receive said enable signal, the other of said two input terminals of said NAND gate receives said control signal, and said output terminal of said NAND gate outputs a first buffer control signal to said first input address buffer via said control unit.

5. The device of claim 4, wherein said first input address buffer includes:
   a NOR gate, having two input terminals and an output terminal, wherein one of said two input terminals of said NOR gate receives said first buffer control signal, the other of said two input terminals of said NOR gate receives said most significant bit address signal;
   a first transmission gate module, having an input terminal and an output terminal, wherein said input terminal of said first transmission gate is coupled to said output terminal of said NOR gate, and said output terminal of said first transmission gate is coupled to said address decoder circuit;
   a second transmission gate module, having an input terminal and an output terminal, wherein said input terminal of said second transmission gate receives said selection signal, said output terminal of said second transmission gate is connected to said output terminal of said first transmission gate module and coupled to said address decoder circuit; and
   a first inverter, having an input terminal and an output terminal, wherein said input terminal of said first inverter receives said enable signal, said output terminal of said first inverter is coupled to said first transmission gate module and said second transmission gate module.

6. The device of claim 5, wherein said first transmission gate module includes:
- a second inverter, having an input terminal and an output terminal, wherein said input terminal of said second inverter is coupled to said output terminal of said NOR gate; and
- a first transmission gate, having an input terminal, an output terminal, an N-type MOS terminal and a P-type MOS terminal, wherein said input terminal of said first transmission gate is coupled to said output terminal of said second inverter, said N-type MOS terminal of said first transmission gate receives said enable signal, said P-type MOS terminal of said first transmission gate is coupled to said output terminal of said first inverter, said output of said first transmission gate is coupled to said address decoder circuit.

7. The device of claim 6, wherein said second transmission gate module includes:
- a second transmission gate, having an input terminal, an output terminal, an N-type MOS terminal and a P-type MOS terminal, wherein said input terminal of said second transmission gate receives said selection signal, said P-type MOS terminal of said second transmission gate receives said enable signal, said N-type MOS terminal of said second transmission gate is coupled to said output terminal of said first inverter, said output terminal of said second transmission gate is connected to said output terminal of said first transmission gate and coupled to said address decoder circuit.

8. The device of claim 4, wherein said selection signal is an address-fixed address signal.

9. The device of claim 1, wherein the number of said sub-memory regions is a base 2 multiple exponential, said multiple is a positive integral.

10. A method for compensating a semiconductor memory defect, suitable for a semiconductor memory, said semiconductor memory including a memory region to store data for access and a plurality of address input ports for inputting an address signal, said address signal determining a location of said data in said memory region, said semiconductor memory including an identification code for representing a size of said semiconductor memory, said method comprising:
- determining whether said memory region of said semiconductor memory has a defect;
- wherein when said memory region of said semiconductor memory is found to be defective, said memory region is divided into a plurality of sub-memory regions, and wherein one of said plurality of sub-memory regions is defectless; and
- replacing said memory region with said defectless sub-memory region to store said data.

11. The method of claim 10, wherein said step of replacing said memory region with said defectless sub-memory region to store said data includes:
- disabling a most significant bit address of said plurality of address input ports; and
- replacing said most significant bit address with a selection signal to select defectless sub-memory region.

12. The method of claim 11, wherein said step of replacing said memory region with said defectless sub-memory region to store said data further includes:
- modifying said identification code of said semiconductor memory to represent a modified size of said semiconductor memory.

* * * * *